United States Patent
Schneider et al.

(10) Patent No.: US 10,172,259 B2
(45) Date of Patent: Jan. 1, 2019

(54) METHOD AND APPARATUS FOR REGULATING A COOLING DEVICE FITTED TO A SWITCHGEAR CABINET

(75) Inventors: Ralf Schneider, Herborn (DE); Michael Scholl, Herborn (DE); Steffen Wagner, Burbach (DE); Michael Maage, Ehringshausen (DE)

(73) Assignee: Rittal GmbH & Co. KG, Herborn (DE)

( * ) Notice: Subject to any disclaimer, the term of this patent is extended or adjusted under 35 U.S.C. 154(b) by 1066 days.

(21) Appl. No.: 13/261,402

(22) PCT Filed: Feb. 9, 2011

(86) PCT No.: PCT/EP2011/051856
§ 371 (c)(1),
(2), (4) Date: Oct. 17, 2012

(87) PCT Pub. No.: WO2011/107329
PCT Pub. Date: Sep. 9, 2011

(65) Prior Publication Data
US 2013/0037253 A1    Feb. 14, 2013

(30) Foreign Application Priority Data
Mar. 1, 2010   (DE) .................. 10 2010 009 776

(51) Int. Cl.
*H05K 7/20*      (2006.01)

(52) U.S. Cl.
CPC ......... *H05K 7/20609* (2013.01); *H05K 7/207* (2013.01)

(58) Field of Classification Search
CPC ..................... H05K 7/20609; H05K 7/207
(Continued)

(56) References Cited

U.S. PATENT DOCUMENTS 4,356,961 A * 11/1982 Smith .................. 236/1 EA
4,784,212 A * 11/1988 Brimer et al. ............. 165/240
(Continued)

FOREIGN PATENT DOCUMENTS

CA    1 325 253 C    12/1993
DE    41 14 700 A1    11/1992
(Continued)

OTHER PUBLICATIONS

Andreas, U.-O, Strieder, H.; Regelungstechnik fuer Heizungs- und Lueftungsbauer (Control Systems for Heating and Ventilation Systems); 2002; Chapter 6.1.6; pp. 359-367; Krammer Verlag, Duesseldorf, Germany.

*Primary Examiner* — Devon Russell
(74) *Attorney, Agent, or Firm* — Marshall & Melhorn, LLC

(57) ABSTRACT

The invention relates to a method for regulating a cooling device fitted in or to a switchgear cabinet, by means of a regulating device, wherein the temperature of the switchgear cabinet interior air is detected and an interior fan assigned thereto for generating an interior air flow through an evaporator and providing cooling air is switched on if the detected temperature of the switchgear cabinet interior air exceeds an upper setpoint temperature, and is switched off if the detected temperature falls below a lower setpoint temperature, and the invention relates to an apparatus for carrying out the method. A reduced energy consumption and an increased service life with reliable operation are achieved by virtue of the fact that after the interior fan has been switched off owing to the lower setpoint temperature being undershot, a timekeeping is started and the interior fan is switched on after a predetermined first time duration for a predetermined second time duration and is then switched off again if the detected temperature still falls below the upper setpoint temperature, as long as the second time duration proceeds, (Continued)

that the intermittent time-controlled mode of operation of the interior fan is cyclically repeated until the upper setpoint temperature is exceeded, after which the interior fan is operated in continuous operation, and that the timekeeping and the intermittent time-controlled mode of operation of the interior fan are started anew if the lower setpoint temperature is undershot.

8 Claims, 2 Drawing Sheets

(58) Field of Classification Search
USPC .................................................. 165/287, 300
See application file for complete search history.

(56) References Cited

U.S. PATENT DOCUMENTS

| | | | |
|---|---|---|---|
| 4,882,908 A | | 11/1989 | White |
| 5,214,930 A | * | 6/1993 | Bendtsen ........................ 62/115 |
| 5,931,011 A | * | 8/1999 | Shima et al. .................... 62/182 |
| 6,550,261 B1 | * | 4/2003 | Shima et al. ................. 62/176.1 |
| 7,836,715 B2 | * | 11/2010 | Eisenhour .................... 62/228.1 |
| 2008/0245085 A1 | * | 10/2008 | Jaffer ........................... 62/228.1 |
| 2010/0030395 A1 | * | 2/2010 | Shimotono et al. .......... 700/300 |
| 2012/0118555 A1 | * | 5/2012 | Tan ................................ 165/287 |
| 2015/0068722 A1 | * | 3/2015 | Ding et al. .................... 165/268 |

FOREIGN PATENT DOCUMENTS

| | | | | |
|---|---|---|---|---|
| DE | 38 52 524 T2 | | 5/1995 | |
| DE | 41 41 494 A1 | | 5/1996 | |
| DE | 44 13 128 C2 | | 12/1997 | |
| DE | 19921674 A1 | * | 11/1999 | ............... H05K 7/20 |
| DE | 100 13 039 A1 | | 10/2001 | |
| DE | 199 51 921 C2 | | 11/2001 | |
| DE | 199 12 029 C2 | | 12/2003 | |
| DE | 603 03 558 T2 | | 12/2006 | |
| DE | 10 2006 051 904 A1 | | 5/2008 | |
| EP | 1 367 331 B1 | | 2/2006 | |
| GB | 2443723 B | | 4/2011 | |

* cited by examiner

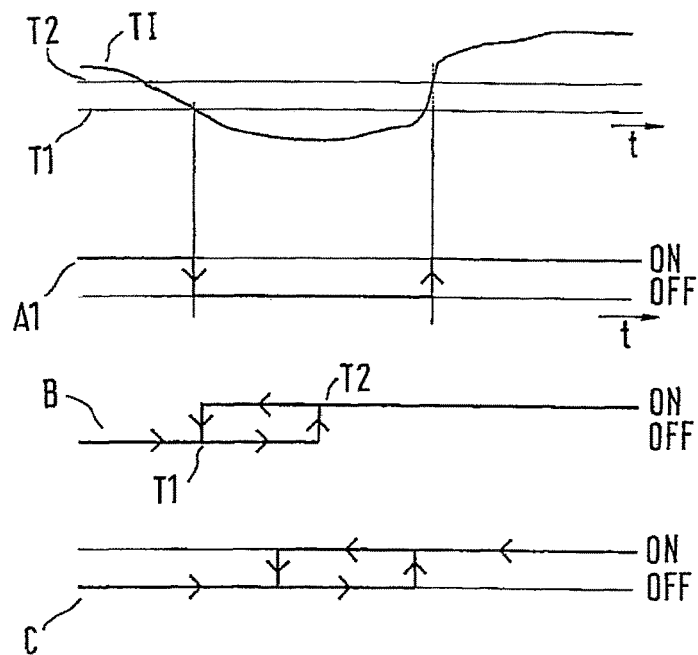
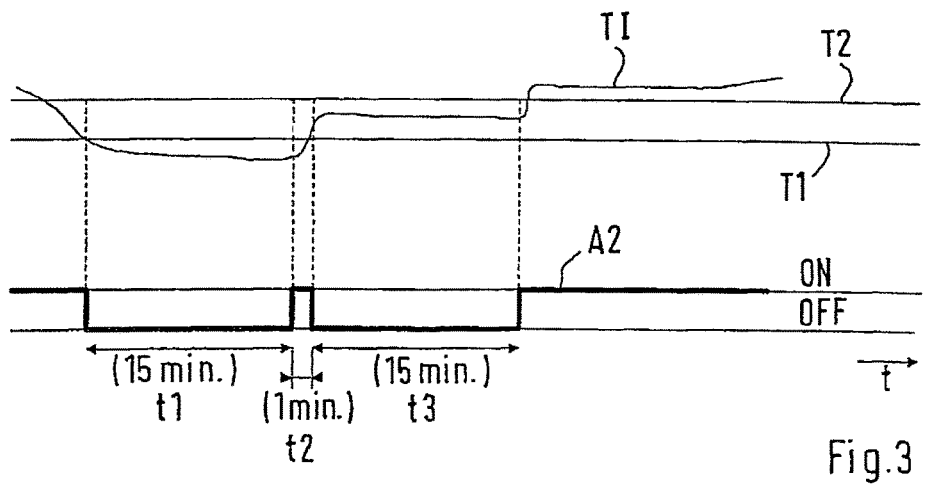

METHOD AND APPARATUS FOR REGULATING A COOLING DEVICE FITTED TO A SWITCHGEAR CABINET

BACKGROUND OF THE INVENTION

The invention relates to a method for regulating a cooling device fitted in or to a switchgear cabinet, by means of a regulating device, wherein the temperature of the switchgear cabinet interior air is detected and an interior fan assigned thereto for generating an interior air flow through an evaporator and providing cooling air is switched on if the detected temperature of the switchgear cabinet interior air exceeds an upper setpoint temperature, and is switched off if the detected temperature falls below a lower setpoint temperature, and to an apparatus for performing the method.

A method of this type for regulating a cooling device fitted to a switchgear cabinet and an apparatus for performing the method are disclosed in DE 44 13 128 C2. By means of the cooling device, switchgear cabinet interior air which increases during operation of built-in components supplying dissipated heat is kept below a temperature which would be disadvantageous for the built-in components, and the dissipated heat produced within the switchgear cabinet is dissipated from the switchgear cabinet. The cooling device has several circuits which in conjunction cool the switchgear interior air. An interior air circuit is driven by an interior fan of the cooling device. A temperature sensor is located in the interior of the cooling device measuring the sucked warm switchgear cabinet interior air. A cooling circuit with a fluid coolant and an ambient air circuit are switched on or off in accordance with a predetermined set temperature. The heat energy of the switchgear cabinet interior air is absorbed by a condenser from the coolant of the cooling circuit. Then, the coolant is highly compressed by a compressor, so that it reaches a higher temperature level in a condenser than the ambient air. Thus, the heat energy transported in the coolant may be supplied to the ambient air circuit which is driven by an external fan. For regulating the interior temperature of the switchgear cabinet or the switchgear cabinet interior air, respectively, the cooling device is operated at intervals wherein the compressor and the external fan are switched on and off at intervals in response to the temperature by means of a regulating device within the apparatus. For measuring the temperature within the cooling device, the switchgear cabinet interior air is guided past a temperature sensor by means of the interior fan, wherein operation of the interior fan contributes significantly to energy consumption.

Other cooling devices for switchgear cabinets are shown in DE 10 2006 051 904 A1, DE 199 12 029 C2 and DE 199 51 921 C2, where different arrangements at a switchgear cabinet are illustrated.

SUMMARY OF THE INVENTION

The invention is based on the object to provide a method of the type mentioned in the introductory by which a more economic operation is achieved while cooling reliably, and to create a respective apparatus.

This object is solved by the features of claim 1 or claim 3, respectively. It is provided that after the interior fan has been switched off owing to the lower setpoint temperature being undershot, a timekeeping is started and the interior fan is switched on after a predetermined first time duration for a second predetermined time duration and is switched off again if the detected temperature still falls below the upper setpoint temperature as long as the second time duration proceeds, that the intermittent time-controlled mode of operation of the interior fan is cyclically repeated until the upper setpoint temperature is exceeded after which the interior fan is operated in continuous operation, and that the timekeeping and the intermittent time-controlled mode are started anew if the lower setpoint temperature is undershot.

For the apparatus, it is provided that a time control unit is included by which a timekeeping may be triggered if the detected temperature undershots the lower setpoint temperature or the interior fan is switched off and a time-controlled operation by switching on the interior fan after a predetermined first time duration for a second predetermined time duration as long as the upper setpoint temperature is not exceeded is performed.

By these features, a sufficient circulation of the switchgear cabinet interior air is ensured reliably, and a temperature level which is beneficial for the cooling of built-in components and safe operation thereof is guaranteed.

Those measures contribute to a reliable operation of the cooling device that a compressor and an external fan of the cooling device remain switched on during the intermittent time-controlled mode of operation, as long as switching on is predetermined by the regulation device.

An advantageous embodiment of the apparatus consists in that the time-controlled operation within the time control unit is predetermined by a program.

BRIEF DESCRIPTION OF THE DRAWINGS

The invention will be explained below in further detail by exemplary embodiments with reference to the drawings. It is shown in.

DETAILED DESCRIPTION OF THE INVENTION

Figure 1:
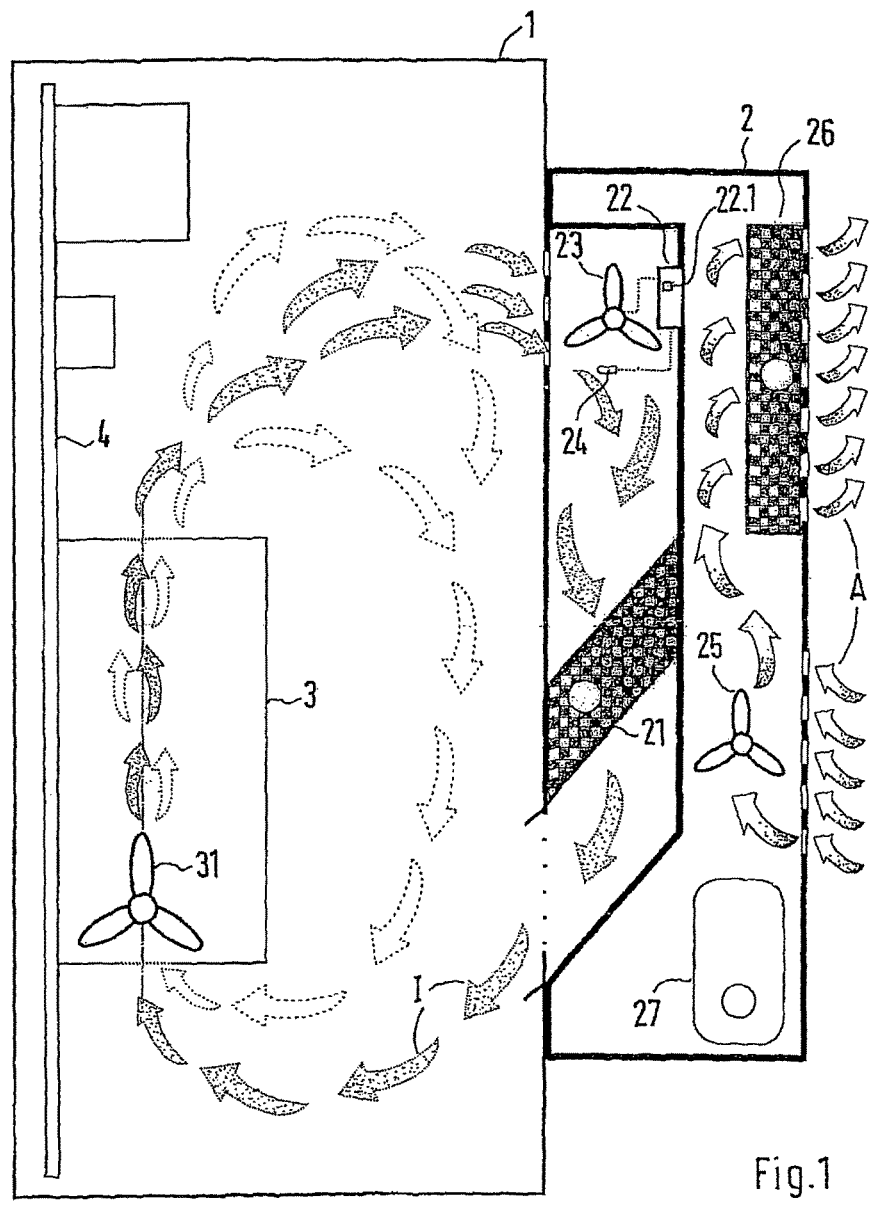
FIG. 1 a schematic illustration of a switchgear cabinet with cooling device fitted thereto and air flow conditions associated therewith, FIG. 2 an example of operating an interior fan and FIG. 3 an exemplary embodiment preferred for the present invention of operating the interior fan.

FIG. 1 show a schematic view of a switchgear cabinet 1 together with a cooling device 2 mounted to the rear wall thereof. Inside switchgear cabinet 1, built-in components 3 are mounted on a mounting plate 4 which produce dissipated heat and which are cooled by means of cooling device 2 via an interior air circuit I.

Within cooling device 2, in a subspace in flow communication with the switchgear cabinet interior via flow apertures, an interior fan 23 in the upper region of the subspace and an evaporator 21 downstream thereof are arranged. Further, cooling device 2 includes a regulating device 22, a time control unit 22.1 and a temperature sensor arranged within the first subspace close to the interior fan 23 for detecting the temperature TI of switchgear interior air flowing from the switchgear interior into the first subspace.

Within cooling device 2, further a cooling circuit for fluid coolant is formed, as well as an ambient air circuit A, wherein ambient air is sucked via ambient air apertures by means of an external fan 25 arranged in a second subspace of the cooling device 2 in a lower region thereof, and, after flowing through a condenser 26, is again discharged to the ambient. The cooling circuit for the coolant includes evaporator 21 where the heat energy of the switchgear cabinet interior air is received by the coolant flowing therethrough, as well as a compressor 27, currently in the lower region of the second subspace, by which the coolant is strongly compressed, so that it, in a condenser 26 positioned in the cooling circuit, reaches a higher temperature level than the ambient air. Thus, heat energy transported in the coolant from the switchgear cabinet interior is discharged to ambient air circuit A driven by external fan 25.

The cooling circuit and ambient air circuit A are switched on and off in accordance with a predetermined set temperature or setpoint temperature, respectively, to meet temperature limits within the switchgear cabinet. This is done by the regulating device 22 of cooling device 2 by which temperature dependent switching on and off of compressor 2 and external fan 25 is accomplished. A precise temperature measurement of the switchgear cabinet interior air is required for a reliable cooling operation. It is provided by means of temperature sensor 24.

Interior air circuit I through the first subspace of cooling device 2 as shown in FIG. 1 results from the operation of the interior fan 23 whereas a different interior air circuit I' is present within the switchgear cabinet while interior fan 23 is switched off where at best a small flow of switchgear cabinet interior air through cooling device 2 occurs. Air flow within the switchgear interior may further be supported by device fans 31 of built-in components 3. In a non-operative condition of the interior fan 23, an imprecise temperature measurement of the air temperature present in the region of the built-in components 3 to be cooled may result owing to bad air mixing.

Consequently, it appears to be appropriate in view of a precise temperature measurement to operate interior fan 23 continuously. However, continuous operation is associated with correspondingly high wear and energy consumption.

FIG. 2 shows an exemplary embodiment wherein interior fan 23 is switched on and off controlled by temperature. In the upper subframe, the operating condition A1 of the interior fan is plotted against time t, and also the profile of the interior temperature TI against time t. If interior air temperature TI exceeds an upper setpoint temperature T2 (e.g. −5° C.), the interior fan is in a switched-on state and is switched off only if the interior air temperature TI falls below a lower setpoint temperature T1 (e.g. −10° C.) (which lies below the upper setpoint temperature). If the interior air temperature TI increases in a non-operative state of cooling device 2 and exceeds upper setpoint temperature T2, interior fan 23 is switched on again and also the cooling operation is enabled.

The representation in the middle of FIG. 2 shows the operation of interior fan 23 in response to the detected temperature. Accordingly, interior fan 23 is put from a switched-off into a switched-on state, if the detected temperature TI corresponds to the upper setpoint temperature T2, and is put from the switched-on to the switched-off state, if the detected temperature TI undershots lower setpoint temperature T1.

In the lower representation of FIG. 2, operation of compressor 27 and external fan 25 in response of the interior temperature of the switchgear cabinet is illustrated. Also here, a hysteresis is provided, wherein compressor 27 and external fan 25 are put from the switched-off state into the switched-on state, if a higher temperature (above the upper setpoint temperature T2) is reached, and from the switched-on state to the switched-off state, if a lower temperature, presently e.g. below upper setpoint temperature T2 and above lower setpoint temperature T1 is reached.

For this temperature-controlled operation, temperature regulation of the interior air temperature of the switchgear cabinet is subject to uncertainties in particular in the region of the built-in components. Consideration could be given to control interior fan 23 by means of temperature signals from a further temperature sensor which is e.g. arranged in proximity of the built-in component 3.

Presently, however, the temperature-controlled regulating operation is superimposed with a time-controlled operation of the interior fan, as illustrated in FIG. 3. If the measured temperature TI of the interior air falls below the lower setpoint temperature T1, coming from a temperature above the upper setpoint temperature T2, interior fan 23 is put from the switched-on state into the switched-off state. Concurrently, timekeeping is triggered and a time signal is provided from time control unit 22.1. After a first time duration t1 (of e.g. 15 minutes) interior fan 23 is switched on for a second time period t2 (of e.g. 1 minute). By doing so, the detected temperature T1 increases in the region of temperature sensor 24 from a level below the lower setpoint temperature T1 to a level above, however, still remains (in the shown example) below upper setpoint temperature T2). Accordingly, interior fan 23 is not yet switched on temperature-controlled, but time-controlled is switched off again for a third time duration t3, which corresponds to the first time duration t1. After expiration of the third time period t3 (of e.g. 15 minutes), interior fan 23 is switched on again, so that the interior air temperature TI which is now detected, exceeds upper setpoint temperature T2 and thus, interior fan 23 remains switched on temperature-controlled. Interior fan 23 maintains the switched-on state until lower setpoint temperature T1 is again undershot. Then, time-controlled operation begins anew with start of timekeeping, as previously described, until in turn upper setpoint temperature T2 is exceeded.

By cyclically intermittent operation of interior fan 23, reliable cooling operation is ensured, since the interior temperature of the switchgear cabinet is detected relatively reliably in the region of temperature sensor 24 owing to the time-controlled operation of interior fan 23. Reliably may be chosen more or less by adjusting first time duration t1 and second time duration t2 of the cyclic operation to the respective requirements.

Time-controlled operation is preferably predetermined by a program wherein time control unit 22.1 is part of a microprocessor control or microcomputer circuit. The time-controlled operation of the interior fan 23 may occur directly by a time control signal of time control unit 22.1 or indirectly thereby via other circuit components.

The invention claimed is:

1. A method for regulating a cooling device fitted in or to a switchgear cabinet with built-in components that produce dissipated heat mounted within the interior of the switchgear cabinet, the built in components comprising device fans for regulating airflow within the switchgear cabinet, the cooling device including an interior fan for generating an interior air flow through an evaporator and providing cooling air to the interior of the switchgear cabinet, comprising:

detecting the temperature of the air within the interior of the switchgear cabinet; and regulating the cooling device in response to the detected temperature such that if the detected temperature of the switchgear cabinet interior air exceeds an upper setpoint temperature, the interior fan of the cooling device is switched on, and if the detected temperature falls below a lower setpoint temperature, the interior fan of the cooling device is switched off, wherein, when the interior fan has been switched off owing to the detected temperature falling below the lower setpoint temperature, an intermittent time-controlled mode of operation is started and the interior fan is switched on after a predetermined first time duration following the start of the intermittent time-controlled mode of operation, and remains on for a second predetermined time duration following the end of the first time duration, and is switched off again if the detected temperature is still below the upper setpoint temperature at the end of the second time duration, and wherein the intermittent time-controlled mode of operation of the interior fan is cyclically repeated until the upper setpoint temperature is exceeded, after which the interior fan is operated in continuous operation, and wherein the intermittent time-controlled mode is started anew if the detected temperature falls below the lower setpoint temperature, and wherein airflow within the switchgear cabinet is supported by the device fans independent of the interior fan being switched on or off.

2. The method of claim 1, wherein the cooling device further comprises a compressor and an external fan, both of which are switched on and off in accordance with predetermined setpoint temperatures, even during the intermittent time-controlled mode of operation.

3. An apparatus for performing the method of claim 2 comprising a coolant circuit, wherein the coolant flows through a compressor and is cooled in a condenser arranged in an ambient air circuit, and comprising a regulating device by which the interior fan is switched on if the detected temperature in the interior air flow exceeds an upper setpoint temperature, and is switched off if the detected temperature falls below a lower setpoint temperature, wherein a time control unit is included, by which the intermittent time-controlled mode of operation may be triggered if the detected temperature falls below the lower setpoint temperature.

4. The apparatus of claim 3, wherein operation of the time control unit is predetermined by a program.

5. An apparatus for performing the method of claim 1, comprising a coolant circuit, wherein the coolant flows through a compressor and is cooled in a condenser arranged in an ambient air circuit, and comprising a regulating device by which the interior fan is switched on if the detected temperature in the interior air flow exceeds an upper setpoint temperature, and is switched off if the detected temperature falls below a lower setpoint temperature, wherein a time control unit is included, by which the intermittent time-controlled mode of operation may be triggered if the detected temperature falls below the lower setpoint temperature.

6. The apparatus of claim 5, wherein the time-controlled mode of operation within the time control unit is predetermined by a program.

7. The method of claim 1, wherein the cooling device further comprises a temperature sensor arranged within a subspace of the cooling device in flow communication with the switchgear interior and close to the interior fan, the temperature sensor detecting the temperature of the air within the interior of the switchgear cabinet by detecting the temperature of the air flowing from the interior of the switchgear cabinet into the subspace of the cooling device.

8. The method of claim 1, wherein the cooling device further comprises a temperature sensor for detecting the temperature of the air within the interior of the switchgear cabinet, a regulating device by which the interior fan is switched on if the detected temperature in the interior air flow exceeds an upper setpoint temperature and is switched off if the detected temperature falls below a lower setpoint temperature, and a time control unit by which the intermittent time-controlled mode of operation may be triggered if the detected temperature falls below the lower setpoint temperature, and wherein the temperature sensor, the regulating device, and the time control unit are arranged within a subspace of the cooling device in flow communication with the switchgear interior.

* * * * *